United States Patent
Aoki et al.

(10) Patent No.: US 8,021,565 B2
(45) Date of Patent: Sep. 20, 2011

(54) SURFACE TREATMENT METHOD, ETCHING METHOD, AND METHOD FOR MANUFACTURING ELECTRONIC DEVICE

(75) Inventors: Katsuaki Aoki, Kanagawa-ken (JP); Naoya Hayamizu, Kanagawa-ken (JP); Kei Hattori, Mie-ken (JP); Yukihiro Oka, Mie-ken (JP); Hidemi Kanetaka, Mie-ken (JP); Makoto Hasegawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 849 days.

(21) Appl. No.: 12/054,092

(22) Filed: Mar. 24, 2008

(65) Prior Publication Data
US 2009/0000640 A1 Jan. 1, 2009

(30) Foreign Application Priority Data

Mar. 28, 2007 (JP) ................................. 2007-084433

(51) Int. Cl.
*C03C 15/00* (2006.01)
(52) U.S. Cl. ............ 216/67; 216/37; 438/714; 438/723; 438/905; 438/906; 134/1.1; 134/1.2; 134/1.3
(58) Field of Classification Search .................... 216/37, 216/67; 156/643.1, 646.1; 438/714, 723, 438/905, 906; 134/1.1–1.3
See application file for complete search history.

(56) References Cited

U.S. PATENT DOCUMENTS

| | | | | |
|---|---|---|---|---|
| 5,314,574 A | * | 5/1994 | Takahashi | ..................... 438/706 |
| 5,679,211 A | | 10/1997 | Huang | |
| 6,186,153 B1 | * | 2/2001 | Kitsunai et al. | ................ 134/1.1 |
| 2007/0298972 A1 | * | 12/2007 | Kent et al. | ..................... 505/500 |

FOREIGN PATENT DOCUMENTS

| | | |
|---|---|---|
| CN | 1777980 A | 5/2006 |
| JP | 5-90239 | 4/1993 |
| JP | 2002-353205 | 12/2002 |
| JP | 2006-216854 | 8/2006 |
| JP | 2007-73840 | 3/2007 |

OTHER PUBLICATIONS

Office Action issued Mar. 3, 2011, in Japan Patent Application No. 2007-084433 (with English translation).

* cited by examiner

*Primary Examiner* — Lan Vinh
*Assistant Examiner* — Maki Angadi
(74) *Attorney, Agent, or Firm* — Oblon, Spivak, McClelland, Maier & Neustadt, L.L.P.

(57) ABSTRACT

A surface treatment method includes: removing a fluorocarbon-containing reaction product from a surface of a workpiece by oxygen gas plasma processing. The workpiece includes a plurality of layers. The fluorocarbon-containing reaction product is deposited by successively etching the layers of the workpiece. The method further includes after removing the reaction product, removing an oxide-containing reaction product from the surface of the workpiece using hydrogen fluoride gas.

20 Claims, 7 Drawing Sheets

SURFACE TREATMENT METHOD, ETCHING METHOD, AND METHOD FOR MANUFACTURING ELECTRONIC DEVICE

CROSS-REFERENCE TO RELATED APPLICATIONS

This application is based upon and claims the benefit of priority from the prior Japanese Patent Application No. 2007-084433, filed on Mar. 28, 2007; the entire contents of which are incorporated herein by reference.

BACKGROUND OF THE INVENTION

1. Field of the Invention

This invention relates to a surface treatment method, an etching method, and a method for manufacturing an electronic device.

2. Background Art

In the manufacturing of highly integrated semiconductor devices in recent years, the surface of a substrate or other workpiece needs to be highly cleaned. To this end, reaction products (deposits) deposited on the workpiece surface and the trench sidewall need to be completely removed.

As a technique for removing reaction products (deposits) deposited on the workpiece surface and the trench sidewall, wet cleaning such as RCA cleaning is known. The wet cleaning allows a relatively simple apparatus to remove the reaction products (deposits), and hence is widely used in the manufacturing of electronic devices such as semiconductor devices. However, the wet cleaning has a problem of high running cost and environmental load because it uses a large amount of chemicals.

For this reason, dry cleaning such as HF (hydrogen fluoride) vapor cleaning, and a combined technique of wet cleaning and dry cleaning are proposed (see JP-A H5-090239 (Kokai) (1993)).

Here, after the completion of the etching process, the workpiece is transported to a cleaning apparatus and subjected to the above wet cleaning or dry cleaning in the cleaning apparatus. In this case, if a long time elapses from the etching process to the cleaning process, corrosion due to reaction products may occur and decrease the product yield.

SUMMARY OF THE INVENTION

According to an aspect of the invention, there is provided a surface treatment method including: removing a fluorocarbon-containing reaction product from a surface of a workpiece by oxygen gas plasma processing, the workpiece including a plurality of layers, and the fluorocarbon-containing reaction product being deposited by successively etching the layers of the workpiece; and after removing the reaction product, removing an oxide-containing reaction product from the surface of the workpiece using hydrogen fluoride gas.

According to another aspect of the invention, there is provided an etching method including: placing a workpiece including a plurality of layers in a reduced-pressure environment; introducing a reaction gas into the reduced-pressure environment; successively etching the layers by generating a plasma of the reaction gas; removing a fluorocarbon-containing reaction product deposited on the workpiece by the etching by oxygen gas plasma processing; and after the etching, removing an oxide-containing reaction product using hydrogen fluoride gas.

According to another aspect of the invention, there is provided a method for manufacturing an electronic device, including: forming a workpiece which includes a plurality of layers; successively etching the layers of the workpiece by generating a plasma of a reaction gas; removing a fluorocarbon-containing reaction product from a surface of the workpiece by oxygen gas plasma processing, the fluorocarbon-containing reaction product being deposited by the successively etching the layers; and after removing the reaction product, removing an oxide-containing reaction product from the surface of the workpiece using hydrogen fluoride gas.

DETAILED DESCRIPTION OF THE INVENTION

An embodiment of the invention will now be described with reference to the drawings.

Figure 1:
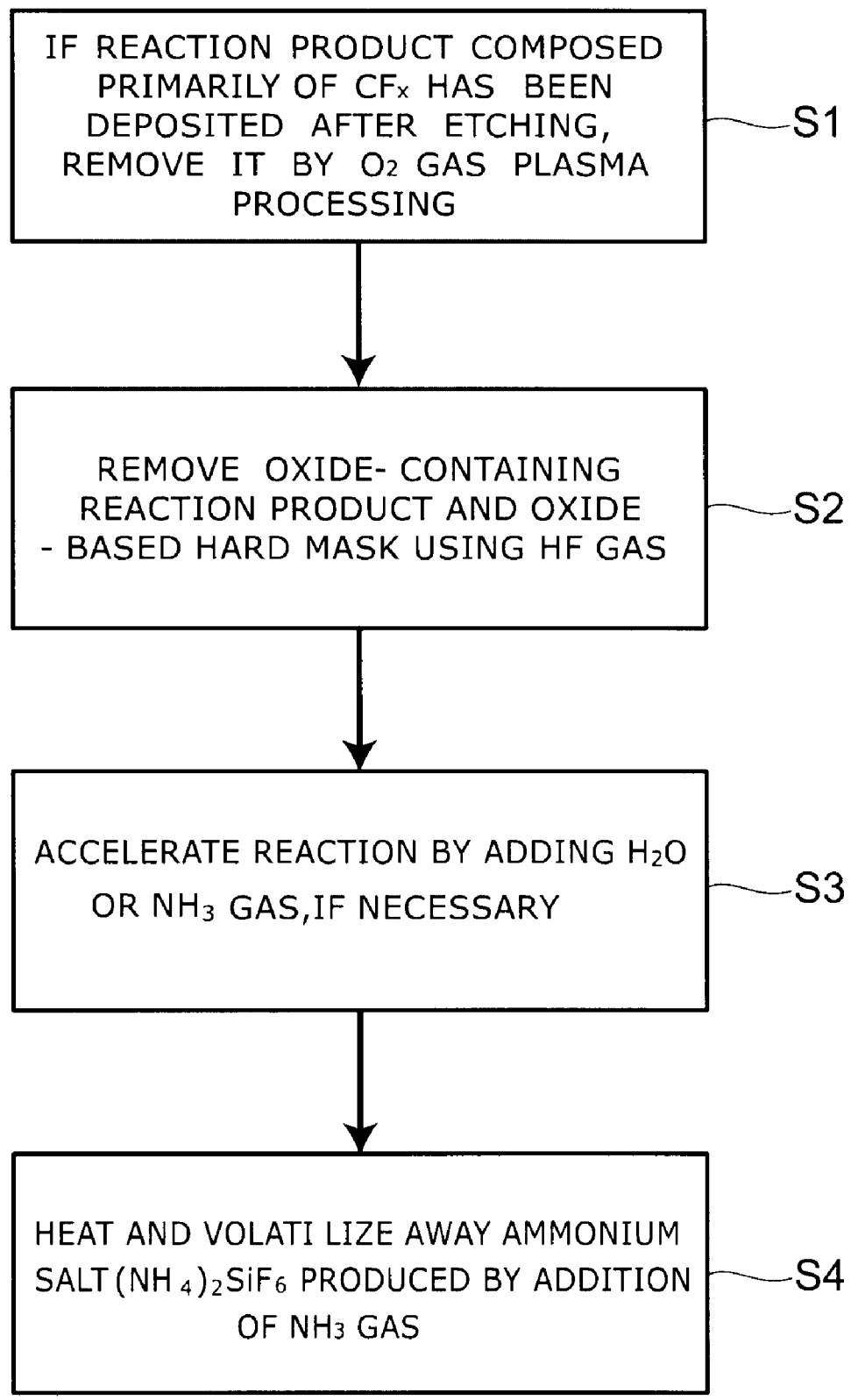
FIG. 1 is a flow chart for illustrating a surface treatment method according to the embodiment of the invention.

FIG. 1 is a flow chart for illustrating a surface treatment method according to the embodiment of the invention.

Figure 2:
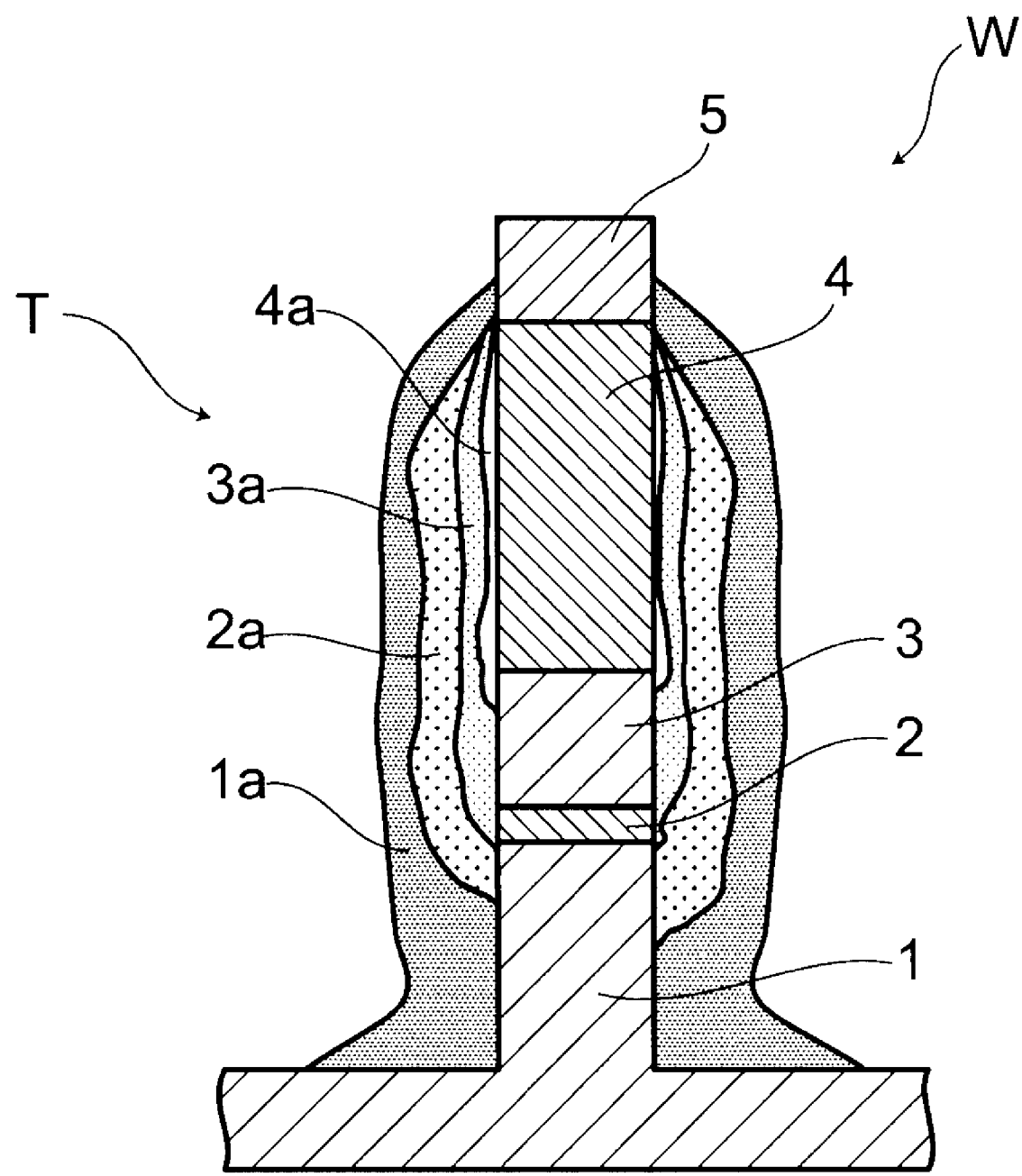
FIG. 2 is a schematic cross-sectional view for illustrating reaction products and a hard mask on a workpiece, showing a schematic cross section of a trench portion of a semiconductor device.

FIG. 2 is a schematic cross-sectional view for illustrating reaction products and a hard mask on a workpiece, showing a schematic cross section of a trench portion of a semiconductor device.

First, a description is given of reaction products and a hard mask on a workpiece shown in FIG. 2.

As shown in FIG. 2, the workpiece W includes, from the bottom up in a laminated manner, a silicon substrate 1, an interlayer insulating film 2, a polysilicon film 3, a nitride film 4, and an oxide film 5 serving as a hard mask. When a trench T is formed in the workpiece W having such layered films, the oxide film 5 is used as a hard mask to successively perform etching from the top down. In such an etching process, RIE (reactive ion etching) can be used, for example.

Figure 3:
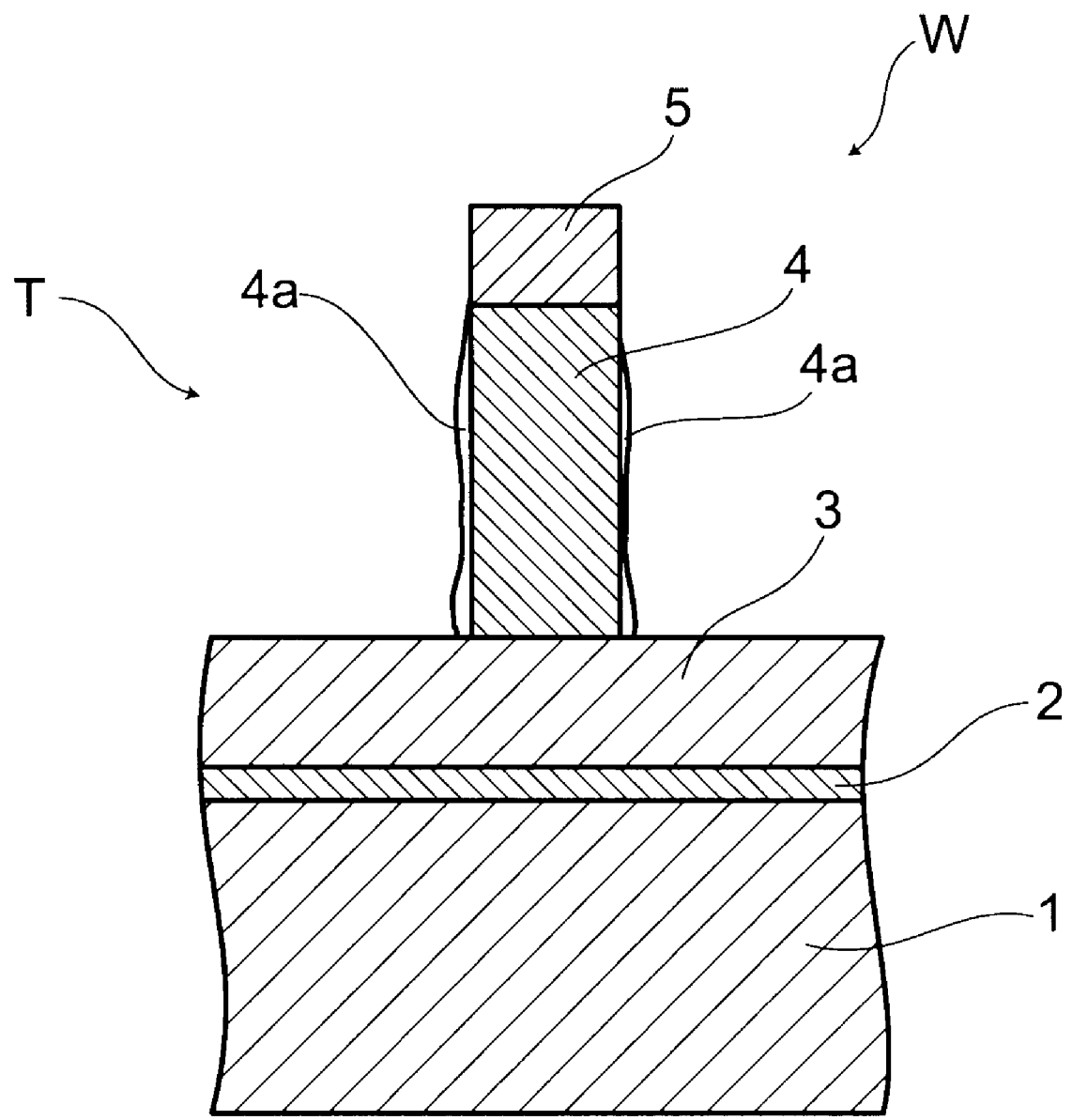
FIGS. 3 to 5 are schematic cross-sectional views for illustrating the situation after etching of various layers.
Figure 4:
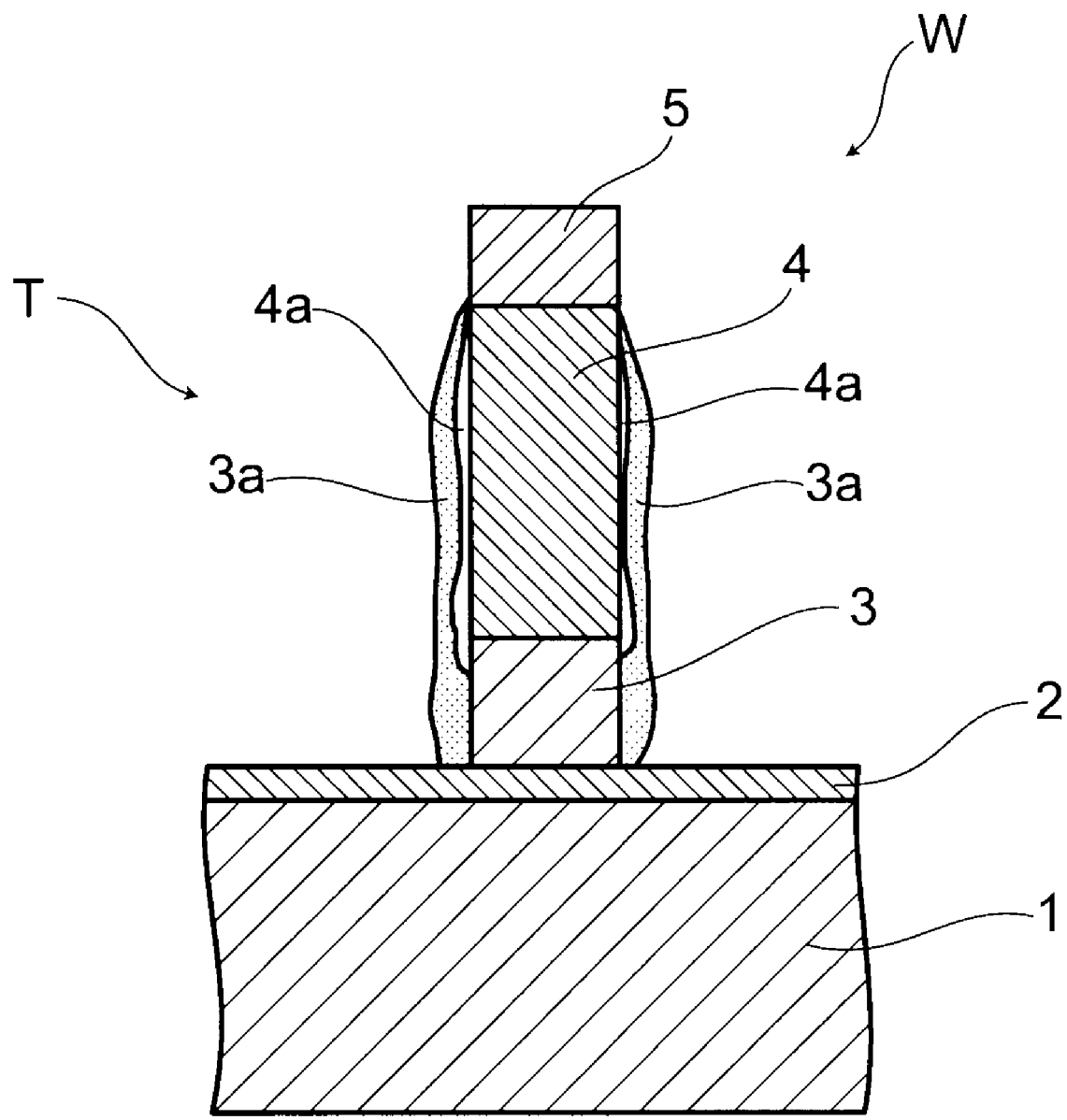
Figure 5:
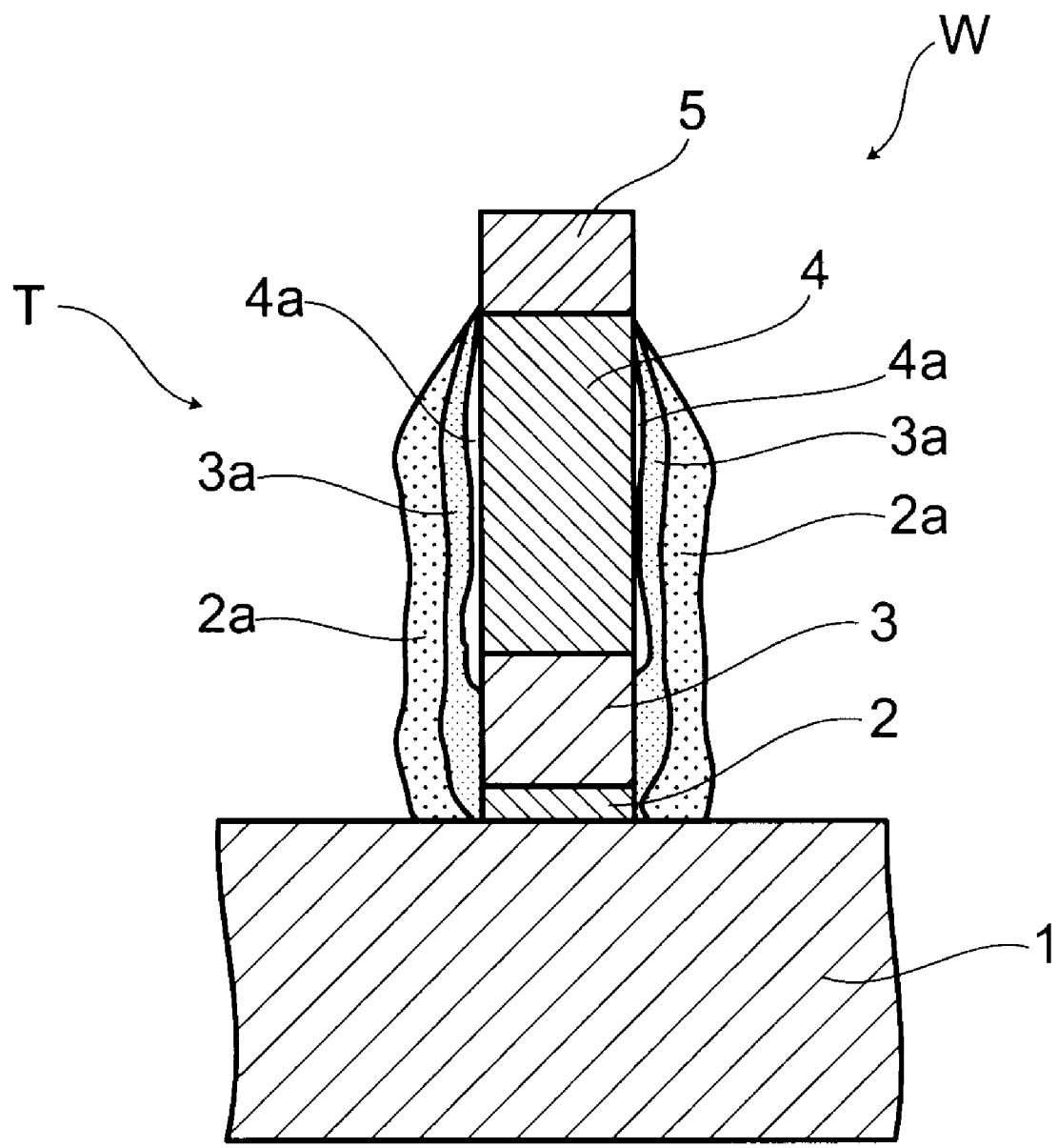

FIGS. 3 to 5 are schematic cross-sectional views for illustrating the situation after etching of various layers.

In etching the nitride film 4 using the oxide film 5 as a hard mask, a mixed gas of $CF_4$ and $O_2$ can be used as the etching gas. In this case, as shown in FIG. 3, a reaction product 4a composed primarily of $CF_x$ is deposited on the sidewall of the trench T.

Next, in etching the polysilicon film 3 underlying the nitride film 4, a mixed gas of HBr, $CF_4$, $O_2$, and $N_2$ can be used as the etching gas. In this case, as shown in FIG. 4, a reaction product 3a composed primarily of SiBr is further deposited on the sidewall of the trench T.

Furthermore, in etching the interlayer insulating film 2 underlying the polysilicon film 3, a mixed gas of $CF_4$, $CH_2F_2$, $O_2$, and He can be used as the etching gas. In this case, as shown in FIG. 5, a reaction product 2a composed primarily of $CF_x$ is further deposited on the sidewall of the trench T.

Moreover, in etching the silicon substrate 1 at the bottom, a mixed gas of HBr, $CF_4$, and $O_2$ can be used as the etching gas. In this case, as shown in FIG. 2, a reaction product 1a composed primarily of SiBrO is further deposited on the sidewall of the trench T.

Here, if wet etching is performed to remove such reaction products, there is a problem of high running cost and environmental load because it uses a large amount of chemicals. On the other hand, if dry cleaning such as HF vapor cleaning is used alone, removal of reaction products may be incomplete. If the combination of wet cleaning and dry cleaning like the technique disclosed in JP-A H5-090239(Kokai) (1993) is used, the manufacturing process is complicated, which may decrease the production efficiency. Furthermore, in the process involving wet etching, transport between the etching apparatus and the cleaning apparatus takes time, and corrosion due to reaction products may occur during the transport.

As a result of investigations, the inventors have found that reaction products can be completely removed without wet cleaning if removal is separately performed in accordance with the property of each reaction product. In the following, a description is given by taking the workpiece W illustrated in FIG. 2 as an example.

As shown in FIG. 1, first, if a reaction product 4a, 2a composed primarily of $CF_x$ has been deposited after etching of various layers, it is removed by $O_2$ (oxygen) gas plasma processing (step S1).

In the $O_2$ (oxygen) gas plasma processing, a reaction gas such as $O_2$ (oxygen) gas is introduced into the same etching apparatus immediately after etching. The reaction gas is excited and activated by plasma to remove the reaction product composed primarily of $CF_x$.

When RIE (reactive ion etching) is used, the processing condition for $O_2$ gas plasma processing can be illustratively as follows: the pressure is 100 mTorr, the 100-MHz high-frequency power at the upper electrode is 750 W, the 3.2-MHz high-frequency power at the lower electrode is 0 W, the $O_2$ (oxygen) gas flow rate is 140 sccm, and the processing time is 30 seconds.

Thus, if the reaction products can be removed in the same apparatus immediately after etching, transport of the workpiece W between the etching apparatus and the surface treatment apparatus can be omitted. Consequently, the production efficiency can be improved. Furthermore, the time taken from etching to removal of the reaction products can be decreased, and hence corrosion due to the reaction products can be significantly reduced.

Figure 6:
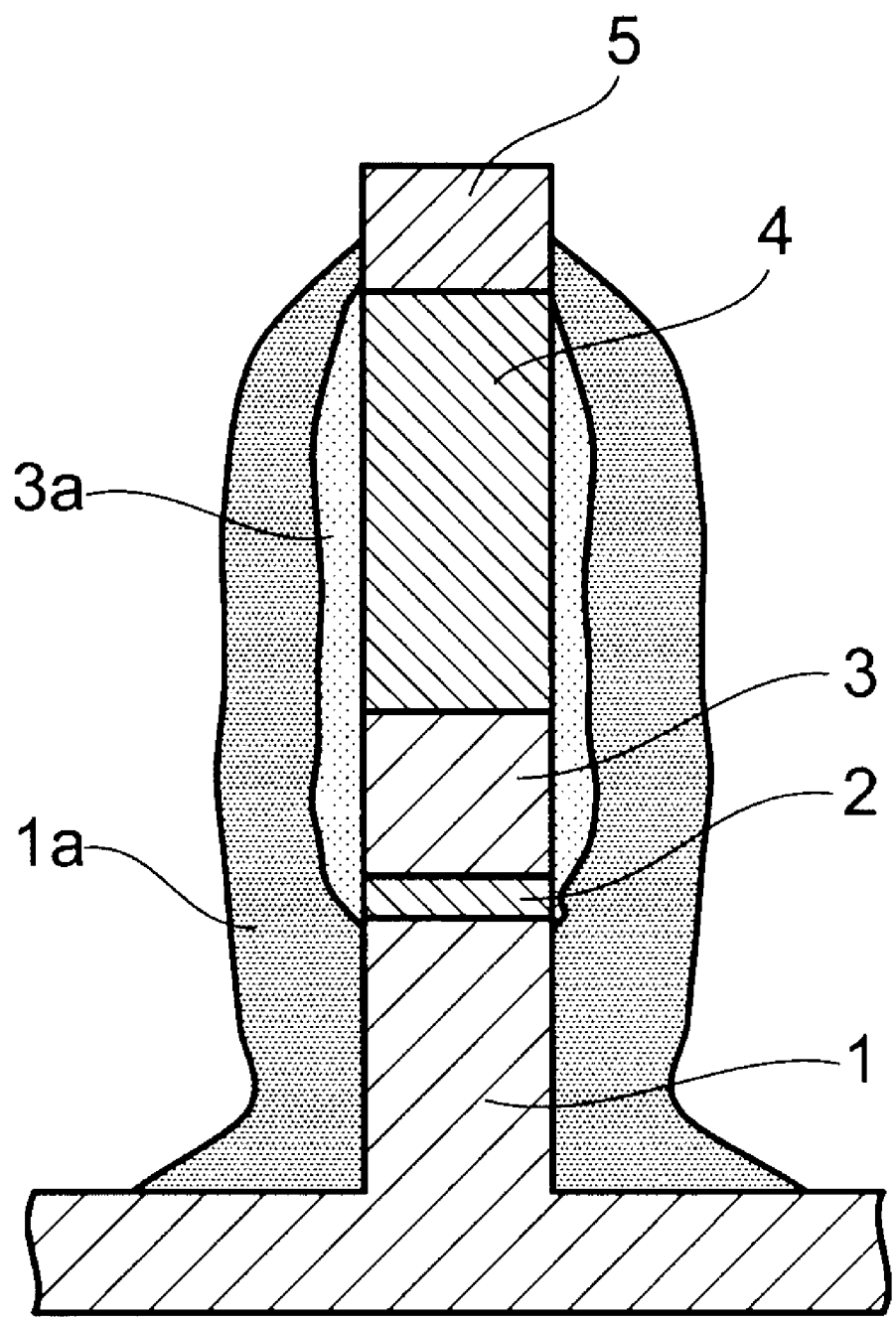
FIG. 6 is a schematic cross-sectional view for illustrating the situation where the reaction product composed primarily of $CF_x$ has been removed by $O_2$ gas plasma processing.

FIG. 6 is a schematic cross-sectional view for illustrating the situation where the reaction product composed primarily of $CF_x$ has been removed by $O_2$ gas plasma processing.

In the example shown in FIG. 6, the $O_2$ gas plasma processing is performed separately after etching of the nitride film 4 and after etching of the interlayer insulating film 2 to remove the reaction products 4a, 2a composed primarily of $CF_x$. Hence the deposition includes only the reaction product 3a composed primarily of SiBr associated with etching of the polysilicon film 3 and the reaction product 1a composed primarily of SiBrO associated with etching of the silicon substrate 1, these etching processes being performed after the removal of the reaction products 4a and 2a, respectively. Consequently, the next step only needs to remove the reaction product 3a composed primarily of SiBr and the reaction product 1a composed primarily of SiBrO.

Here, the reaction product 1a and the reaction product 3a contain oxides of group 14 elements such as silicon and germanium. For example, the reaction product 3a illustrated in FIG. 6 is composed primarily of SiBr, and the reaction product 1a is composed primarily of SiBrO. Furthermore, the hard mask, which is to be finally removed, is made of oxides of group 14 elements (e.g., $SiO_2$).

As a result of investigations, the inventors have found that not only the oxide-containing reaction product but also the oxide-based hard mask can be removed by HF (hydrogen fluoride) gas, used alone or with the addition of $H_2O$ (water) or $NH_3$ (ammonia) gas.

If HF (hydrogen fluoride) gas is primarily used, the oxide-containing reaction product and the oxide-based hard mask can be removed in the same apparatus immediately after etching. Thus transport of the workpiece W between the etching apparatus and the surface treatment apparatus can be omitted, and hence the production efficiency can be improved. Furthermore, the time taken from etching to removal of the reaction products can be decreased, and hence corrosion due to the reaction products can be significantly reduced.

Alternatively, the workpiece W can be transported into a surface treatment apparatus separate from the etching apparatus, and the reaction products can be removed in the surface treatment apparatus. In this case, the transport path is preferably located in a reduced-pressure environment. Then corrosion due to the reaction products can be reduced. It is noted that, depending on the type of the workpiece W, requirements for avoiding corrosion may be relaxed. In such cases, transport can be performed in the atmosphere. However, even in such cases, the etching apparatus and the surface treatment apparatus are preferably placed as close as possible to each other.

As described above, after the reaction product composed primarily of $CF_x$ is removed by $O_2$ gas plasma processing, the oxide-containing reaction product and the oxide-based hard mask are removed using HF (hydrogen fluoride) gas (step S2).

Here, if the reaction product composed primarily of $CF_x$ and the oxide-containing reaction product are each made of a single layer, the $O_2$ gas plasma processing and the HF gas-based removal processing can be continuously performed. However, if they are multilayer as shown in FIG. 2, then each time a reaction product composed primarily of $CF_x$ is deposited, it is removed by $O_2$ gas plasma processing, and after the completion of etching, the oxide-containing reaction product and the oxide-based hard mask are removed all at once using HF (hydrogen fluoride) gas.

Here, the removal processing can be performed by supplying HF gas into the etching apparatus. Alternatively, as described previously, the removal processing can be performed by supplying HF gas into the surface treatment apparatus.

The removal processing proceeds on the basis of the following reactions:

(1)

(2)

(3)

Here, existence of $H_2O$ in the HF gas accelerates the reaction. While $H_2O$ can be added as water vapor, the reaction can be accelerated also by $H_2O$ attached to the surface of the workpiece W during the above-described transport in the atmosphere or existing in the oxide-based hard mask. Furthermore, the reaction can be also accelerated by adding $NH_3$ (ammonia) gas to produce $H_2O$ as described below.

To this end, the reaction is accelerated by adding $H_2O$ and/or $NH_3$ gas, if necessary (step S3):

(4)

$$SiO_2 + NH_4F \rightarrow (NH_4)_2SiF_6 + H_2O \quad (5)$$

$$NH_4F \rightarrow NH_4^+ + F^- \quad (6)$$

$$HF + F^- \rightarrow HF_2^- \quad (7)$$

$$SiO_2 + HF_2^- + NH_3 \rightarrow (NH_4)_2SiF_6 \quad (8)$$

The ammonium salt $(NH_4)_2SiF_6$ produced by addition of $NH_3$ gas is volatilized away by heating (step S4).

Here, the ammonium salt $(NH_4)_2SiF_6$ is removed by the reaction represented by formula (9):

$$(NH_4)_2SiF_6 \rightarrow SiF_4 + 2NH_3 + 2HF \quad (9)$$

The processing condition for removing the oxide-containing reaction product and the oxide-based hard mask can be illustratively as follows: the HF gas is supplied at 2000 sccm, the processing temperature is 25° C., and the processing time is 60 seconds.

The heating temperature in formula (9) can be approximately 200° C.

Figure 7:
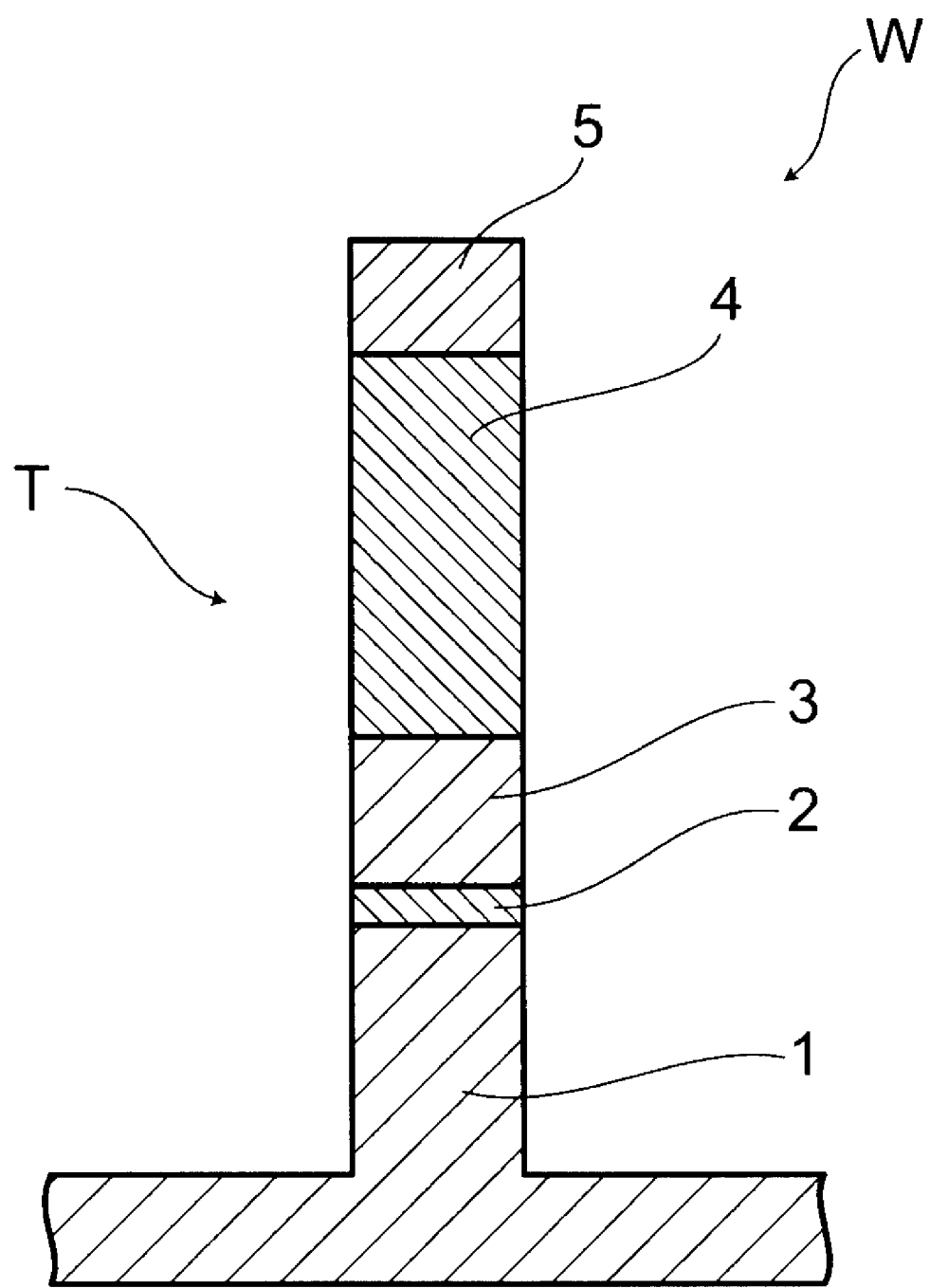
FIG. 7 is a schematic cross-sectional view for illustrating the situation after removing the reaction products and the hard mask.

FIG. 7 is a schematic cross-sectional view for illustrating the situation after removing the reaction products and the hard mask.

As shown in FIG. 7, according to the surface treatment method of this embodiment, the reaction products can be completely removed even without using wet cleaning. Hence the running cost and the environmental load can be reduced. Furthermore, because the removal processing can be performed in the etching apparatus immediately after etching, it is possible to decrease process steps, to improve production efficiency, and to prevent corrosion due to reaction products. Furthermore, the hard mask, which conventionally needs a separate removal processing, can be removed simultaneously. Hence the step of removing the hard mask can be omitted.

The surface treatment method according to this embodiment can also be integrally performed as part of the etching process. This is described by taking as an example the trench formation described with reference to FIGS. 3 to 5.

First, as shown in FIG. 3, the nitride film 4 is etched using the oxide film 5 as a hard mask. The etching gas can be a mixed gas of $CF_4$ and $O_2$, for example. In this case, a reaction product 4a composed primarily of $CF_x$ is deposited on the sidewall of the trench T. Hence the etching is followed by $O_2$ gas plasma processing, where the reaction product 4a composed primarily of $CF_x$ is removed.

Next, as shown in FIG. 4, the polysilicon film 3 underlying the nitride film 4 is etched. The etching gas can be a mixed gas of HBr, $CF_4$, $O_2$, and $N_2$, for example. In this case, a reaction product 3a composed primarily of SiBr is deposited on the sidewall of the trench T. Because the reaction product 4a has been removed by $O_2$ gas plasma processing, the deposition includes only the reaction product 3a.

Next, as shown in FIG. 5, the interlayer insulating film 2 underlying the polysilicon film 3 is etched. The etching gas can be a mixed gas of $CF_4$, $CH_2F_2$, $O_2$, and He, for example. In this case, a reaction product 2a composed primarily of $CF_x$ is further deposited on the sidewall of the trench T. Hence the etching is followed by $O_2$ gas plasma processing, where the reaction product 2a composed primarily of $CF_x$ is removed.

Next, the silicon substrate 1 at the bottom is etched. The etching gas can be a mixed gas of HBr, $CF_4$, and $O_2$, for example. In this case, a reaction product 1a composed primarily of SiBrO is further deposited on the reaction product 3a that has been deposited on the sidewall of the trench T.

The oxide-containing reaction products 1a, 3a thus deposited and the oxide film 5 serving as a hard mask are removed using HF (hydrogen fluoride) gas. It is noted that, as described previously, the reaction can be also accelerated by adding $H_2O$ and/or $NH_3$ gas.

As described above, the surface treatment according to this embodiment can be performed as part of the etching process. In this case, if the surface treatment according to this embodiment is performed in the same apparatus immediately after etching, transport of the workpiece W between the etching apparatus and the surface treatment apparatus can be omitted, and hence the production efficiency can be improved. Furthermore, the time taken from etching to removal of the reaction products can be decreased, and there is no exposure to the atmosphere. Hence corrosion due to the reaction products can be significantly reduced.

Next, a method for manufacturing a semiconductor device according to the embodiment of the invention is described. This method for manufacturing a semiconductor device uses the above-described surface treatment method according to the embodiment of the invention when etching is performed. The manufacturing method is performed by repeating the step of forming a pattern on a substrate (wafer) surface by film formation, resist coating, exposure, development, etching, and resist removal, the step of inspecting the pattern, and a plurality of steps including heat treatment, doping, diffusion, and planarization. The steps other than the surface treatment method according to the embodiment of the invention can be based on known techniques for the respective steps, and hence are not further described.

For convenience of description, the surface treatment method according to the embodiment of the invention is described with reference to its application to a method for manufacturing a semiconductor device. However, the invention is not limited thereto. For example, the invention is also widely applicable to various cases where oxides to be finally removed, oxide-containing reaction products resulting from etching, and reaction products composed primarily of $CF_x$ are layered on the surface or in the trench of the workpiece.

An example of such cases is pattern etching in manufacturing a liquid crystal display device.

Here, a description is given of the case where the surface treatment method according to the embodiment of the invention is applied to a method for manufacturing a TFT (thin film transistor) color liquid crystal display panel.

The process for manufacturing a TFT color liquid crystal display panel comprises the steps of forming a TFT array, forming a color filter, forming an alignment film, laminating a substrate, injecting liquid crystal, and cutting the substrate.

Here, the surface treatment method according to the above embodiment can be used for forming a pixel array in the step of forming a TFT array. The steps other than the surface treatment method according to this embodiment can be based on known techniques for the respective steps, and hence are not further described.

The embodiment of the invention has been described. However, the invention is not limited to the foregoing description.

Any modifications to the above embodiment appropriately made by those skilled in the art are also encompassed within the scope of the invention as long as they include the features of the invention.

For example, the surface treatment method according to this embodiment is described with reference to forming a trench of a semiconductor device. However, the invention is not limited thereto, but is also operable to remove reaction products deposited on a surface due to formation of other portions of the semiconductor device, an oxide film to be finally removed, or an oxide-based mask. The shape, dimension, material, and arrangement of the semiconductor device of the embodiment are not limited to those illustrated above, but can be appropriately modified.

Furthermore, the components included in the above embodiment can be combined with each other as long as feasible, and such combinations are also encompassed within the scope of the invention as long as they include the features of the invention.

The invention claimed is:

1. A surface treatment method, comprising:
removing a fluorocarbon-containing reaction product from a surface of a workpiece by oxygen gas plasma processing, the workpiece including a plurality of layers, and the fluorocarbon-containing reaction product being deposited by successively etching the layers of the workpiece; and
after removing the fluorocarbon-containing reaction product, removing an oxide-containing reaction product from the surface of the workpiece with hydrogen fluoride gas; wherein
each time the fluorocarbon-containing reaction product is deposited by etching the layers of the workpiece, the fluorocarbon-containing reaction product is removed from the surface of the workpiece by oxygen gas plasma processing; and
after the etching of the plurality of the layers is completed, the oxide-containing reaction product is removed all at once from the surface of the workpiece with hydrogen fluoride gas.

2. The surface treatment method according to claim 1, wherein the workpiece includes an oxide-based hard mask, and the oxide-based hard mask is removed with hydrogen fluoride gas.

3. The surface treatment method according to claim 2, wherein the removing the oxide-based hard mask is performed in a same apparatus which is used for the etching.

4. The surface treatment method according to claim 2, wherein the removing at least one of the fluorocarbon-containing product, the oxide-containing reaction product and the oxide-based hard mask is performed in a surface treatment apparatus separate from an etching apparatus used for the etching and a transport path between the surface treatment apparatus and the etching apparatus is located in a reduced-pressure environment.

5. The surface treatment method according to claim 1, wherein the oxide is an oxide of a group 14 element.

6. The surface treatment method according to claim 1, wherein the removal with hydrogen fluoride gas is performed after completion of the etching.

7. The surface treatment method according to claim 1, wherein at least one of water and ammonia gas is added to the hydrogen fluoride gas.

8. The surface treatment method according to claim 7, wherein ammonia gas is added to the hydrogen fluoride gas and wherein an ammonium salt produced by the addition of ammonia gas is removed by heating.

9. The surface treatment method according to claim 1, wherein the removing the fluorocarbon-containing reaction product is performed in a same apparatus which is used for the etching.

10. The surface treatment method according to claim 1, wherein the removing the oxide-containing reaction product is performed in a same apparatus which is used for the etching.

11. The surface treatment method according to claim 1, wherein the removing at least one of the fluorocarbon-containing product and the oxide-containing reaction product is performed in a surface treatment apparatus separate from an etching apparatus used for the etching and a transport path between the surface treatment apparatus and the etching apparatus is located in a reduced-pressure environment.

12. An etching method, comprising:
placing a workpiece including a plurality of layers in a reduced-pressure environment;
introducing a reaction gas into the reduced-pressure environment;
successively etching the layers by generating a plasma of the reaction gas;
each time a fluorocarbon-containing reaction product is deposited on the workpiece by the etching the layers, removing the fluorocarbon-containing reaction product from the surface of the workpiece by oxygen gas plasma processing; and
after the etching of the plurality of the layers is completed, removing an oxide-containing reaction product all at once from the surface of the workpiece with hydrogen fluoride gas.

13. The etching method according to claim 12, wherein after the etching an oxide-based hard mask is removed with hydrogen fluoride gas.

14. The etching method according to claim 13, wherein the removing the oxide-based hard mask is performed in a same apparatus which is used for the etching.

15. The etching method according to claim 12, wherein the oxide is an oxide of a group 14 element.

16. The etching method according to claim 12, wherein at least one of water and ammonia gas is added to the hydrogen fluoride gas.

17. The etching method according to claim 16, wherein ammonia gas is added to the hydrogen fluoride gas and wherein an ammonium salt produced by the addition of ammonia gas is removed by heating.

18. The etching method according to claim 12, wherein the removing the fluorocarbon-containing reaction product is performed in a same apparatus which is used for the etching.

19. The etching method according to claim 12, wherein the removing the oxide-containing reaction product is performed in a same apparatus which is used for the etching.

20. A method for manufacturing an electronic device, comprising:
forming a workpiece which includes a plurality of layers;
successively etching the layers of the workpiece by generating a plasma of a reaction gas;
removing a fluorocarbon-containing reaction product from a surface of the workpiece by oxygen gas plasma processing, the fluorocarbon-containing reaction product being deposited by the successively etching the layers; and
after removing the fluorocarbon-containing reaction product, removing an oxide-containing reaction product from the surface of the workpiece with hydrogen fluoride gas; wherein
each time the fluorocarbon-containing reaction product is deposited by etching a layer of the workpiece, the fluorocarbon-containing reaction product is removed from the surface of the workpiece by oxygen gas plasma processing; and
after the etching of the plurality of the layers is completed, the oxide-containing reaction product is removed all at once from the surface of the workpiece with hydrogen fluoride gas.

* * * * *